United States Patent
Comtois et al.

(10) Patent No.: US 10,368,451 B2
(45) Date of Patent: Jul. 30, 2019

(54) MODULE FOR THE INTERCONNECTION OF A CIRCUIT BREAKER AND A CONTACTOR FOR AN ELECTRICAL ASSEMBLY

(71) Applicant: SCHNEIDER ELECTRIC INDUSTRIES SAS, Rueil Malmaison (FR)

(72) Inventors: Patrick Comtois, Saint-Ismier (FR); Gilles Baurand, Montesson (FR)

(73) Assignee: SCHNEIDER ELECTRIC INDUSTRIES SAS, Rueil-Malmaison (FR)

(*) Notice: Subject to any disclaimer, the term of this patent is extended or adjusted under 35 U.S.C. 154(b) by 164 days.

(21) Appl. No.: 15/491,102

(22) Filed: Apr. 19, 2017

(65) Prior Publication Data

US 2018/0014412 A1 Jan. 11, 2018

(30) Foreign Application Priority Data

Jul. 8, 2016 (FR) ...................................... 16 56573

(51) Int. Cl.
*H05K 5/00* (2006.01)
*G05B 15/02* (2006.01)
(Continued)

(52) U.S. Cl.
CPC .......... *H05K 5/0017* (2013.01); *G01R 15/16* (2013.01); *G05B 15/02* (2013.01); *H01H 89/06* (2013.01); *H01H 2089/065* (2013.01)

(58) Field of Classification Search
CPC .......... H05K 5/17; H01H 89/06; G05B 15/02; G05B 15/16
See application file for complete search history.

(56) References Cited

U.S. PATENT DOCUMENTS

| 6,278,605 | B1 * | 8/2001 | Hill ......................... H02B 1/26 200/307 |
| 6,362,445 | B1 * | 3/2002 | Marchand .......... H02B 13/0354 218/155 |

(Continued)

FOREIGN PATENT DOCUMENTS

| DE | 43 35 965 | 4/1995 |
| DE | 100 23 966 | 11/2001 |

OTHER PUBLICATIONS

French Preliminary Search Report dated Mar. 2, 2017 in French Application 16 56573, filed on Jul. 8, 2016 (with English Translation of Categories of cited documents).

*Primary Examiner* — Tung X Nguyen
*Assistant Examiner* — Dominic E Hawkins
(74) *Attorney, Agent, or Firm* — Oblon, McClelland, Maier & Neustadt, L.L.P.

(57) ABSTRACT

A module for the interconnection between an electrical circuit breaker and an electrical contactor includes a housing and multiple high-power electrical conductors that are housed inside the housing, each of the high-power electrical conductors being suitable for electrically connecting an electrical output of a circuit breaker to an electrical input of a contactor, in order to allow a supply electric current to flow from the circuit breaker to the contactor. The interconnection module additionally includes a device for measuring the current, which device is suitable for measuring the values of the current that flows through the high-power electrical conductors, and an electronic processing unit, which unit is equipped with an interface for connection to a data bus and which unit is programmed to transmit the values measured by the measurement device to the data bus.

10 Claims, 7 Drawing Sheets

(51) Int. Cl.
    *G01R 15/16*        (2006.01)
    *H01H 89/06*        (2006.01)

(56) References Cited

U.S. PATENT DOCUMENTS

| | | | | |
|---|---|---|---|---|
| 6,677,743 | B1* | 1/2004 | Coolidge | G01R 15/16 |
| | | | | 324/126 |
| 7,192,289 | B2* | 3/2007 | Kowalski | H01R 31/02 |
| | | | | 439/106 |
| 2004/0246661 | A1* | 12/2004 | Busch | H01H 89/06 |
| | | | | 361/605 |
| 2005/0122117 | A1 | 6/2005 | Baurand et al. | |
| 2006/0202671 | A1* | 9/2006 | Mulligan | G01R 15/16 |
| | | | | 324/72.5 |
| 2009/0167289 | A1* | 7/2009 | Hartinger | H01H 89/06 |
| | | | | 324/76.11 |
| 2011/0089933 | A1* | 4/2011 | Javora | G01R 15/142 |
| | | | | 324/127 |
| 2011/0136353 | A1* | 6/2011 | Spitaels | H01R 25/003 |
| | | | | 439/95 |
| 2012/0271576 | A1* | 10/2012 | Kamel | H02J 13/0006 |
| | | | | 702/62 |
| 2014/0124262 | A1* | 5/2014 | Martin | H01H 71/08 |
| | | | | 174/88 R |
| 2015/0096171 | A1* | 4/2015 | Krapf | H02J 9/066 |
| | | | | 29/825 |
| 2015/0192618 | A1* | 7/2015 | Juds | H01G 4/30 |
| | | | | 324/76.11 |
| 2016/0377662 | A1* | 12/2016 | Kasai | G01R 19/0084 |
| | | | | 324/149 |
| 2017/0184697 | A1* | 6/2017 | Kostrba | G01R 35/005 |

* cited by examiner

MODULE FOR THE INTERCONNECTION OF A CIRCUIT BREAKER AND A CONTACTOR FOR AN ELECTRICAL ASSEMBLY

The invention concerns a module for the interconnection of a circuit breaker and a contactor for an electrical assembly. The invention also concerns an electrical device including an interconnection module of this kind and a contactor. The invention finally concerns an electrical assembly including a circuit breaker and an electrical contactor electrically connected to each other by means of an interconnection module of this kind.

Electrical assemblies are known intended to control the supply of electrical power to an electrical load and to protect said electrical load. For example, motor starter systems are known for controlling industrial electric motors, such as asynchronous motors.

An electrical assembly of this kind typically includes, for each electrical load, a circuit breaker and a contactor that control the supply of electrical power to said electrical load. The circuit breaker, on the upstream side, protects the electrical power supply against anomalies such as short circuits and overcurrents. The contactor, on the downstream side, enables selective interruption of the supply of power to the electrical load in response to a control signal. The interconnection module electrically interconnects a power output of the circuit breaker and a power input of the contactor. An interconnection module of this kind is described in FR 2806525 A1 for example.

If a plurality of electrical loads is used, it is standard practice to use a plurality of motor starter systems interconnected in parallel, each supplying electrical power to one load. Said electrical assemblies can be interconnected by means of a data bus that enables exchange of information between each of the electrical assemblies and a central control unit. For example, this bus enables transmission of a control signal to a contactor or measurement of the status of each contactor at a given time for the purposes of remote diagnostics. An example of a data bus of this kind is described in the application US 2011/0119507 A1.

These known devices are not entirely satisfactory, however. They do not enable information to be obtained on the value of the current that flows at a given time between the circuit breaker and the contactor of an electrical assembly of this kind because the data bus is separate from the power connection between the circuit breaker and the contactor.

It is these disadvantages that the invention is more particularly intended to remedy by proposing a module for the interconnection between a circuit breaker and a contactor for an electrical assembly, said interconnection module enabling reliable measurement and collection of information on the power current between the circuit breaker and the contactor in real time when the system is operating.

To this end, the invention consists in a module for the interconnection between an electrical circuit breaker and an electrical contactor comprising a housing and multiple power electrical conductors housed inside the housing, each of the power electrical conductors being adapted to connect an electrical output of a circuit breaker electrically to an electrical input of a contactor, in order to allow a power supply electric current to flow from the circuit breaker to the contactor, wherein the interconnection module additionally comprises:
 a device for measuring the current adapted to measure the current that flows through the power electrical conductors, and
 an electronic processing unit equipped with an interface for connection to a data bus and programmed to transmit the values measured by the measurement device to the data bus.

Thanks to the invention, by incorporating a current measuring device in the interconnection module itself, reliable means are provided for measuring the current that flows through the power conductors between the circuit breaker and the contactor. The electronic processing unit enables collection of the information measured by the measuring device and its transmission to the data bus. It is therefore possible to centralize all exchanges of data with the contactor at the level of the interconnection module and to transmit the data to a control unit of the motor output line.

In contrast to this, in the known prior art, data is exchanged only with a data exchange interface of the contactor, whether that be to transmit a control signal or to collect information on the status of the contactor. An interface of this kind is separate from the power connection between the circuit breaker and the contactor, with the result that it is not possible to measure information relating to the current that flows between the contactor and the circuit breaker.

According to advantageous and optional embodiments of the invention, the interconnection module may have one or more of the following features, in any technically permissible combination:
 The module includes an electrical voltage sensor for detecting an electrical voltage between at least two of the power electrical conductors and the electronic processing unit is electrically connected to the voltage sensor and is programmed to transmit a signal to the data bus if an electrical voltage of this kind is detected by the voltage sensor.
 The current measuring device includes Rogowski type current sensors, each mounted around one of the power electrical conductors to measure the electrical current that flows in that power electrical conductor.
 The voltage sensor includes at least one electrically conductive plate disposed at a distance from and facing one of the power electrical conductors, the electrical voltage being detected as a function of the value of the electrical capacitance between the electrically conductive plate and the corresponding power electrical conductor.
 The module includes a data link adapted to be connected to a control circuit of the contactor, the electronic processing unit being moreover programmed to deliver a control signal to the contactor via said interface.
 The module includes a separation plate housed inside the casing and including an area at least partly moulded over the power electrical conductors.
 The electronic processing unit is on an electronic circuit card fixed to the separation plate.

According to another aspect, the invention concerns an electrical device including:
 an electrical contactor including separatable electrical contacts adapted to connect selectively or to insulate the current inputs and the current outputs of the contactor electrically from one another in response to a control signal,
 an interconnection module including power electrical conductors electrically connected to the current inputs of the electrical contactor and adapted to connect said electrical contactor electrically to an electrical circuit breaker.

According to the invention, the interconnection module is as described above, the power electrical conductors of the interconnection module being electrically connected to the current inputs of the contactor.

According to advantageous optional embodiments of the invention, the electrical device may have the following feature:

The interconnection module is as described above and the data link is connected to a corresponding interface of the electrical contactor to switch the movement of the separatable contacts of the contactor between open and closed states.

According to a further aspect, the invention concerns an electrical assembly including an electrical circuit breaker and an electrical device including an electrical contactor and an interconnection module connected to the contactor, in which the interconnection module is between the circuit breaker and the contactor and electrically connects the circuit breaker to the contactor. According to the invention the electrical device is as described above.

The invention will be better understood and its other advantages will become more clearly apparent in the light of the following description of one embodiment of an interconnection module given by way of example only and with reference to the appended drawings, in which.

Figure 1:
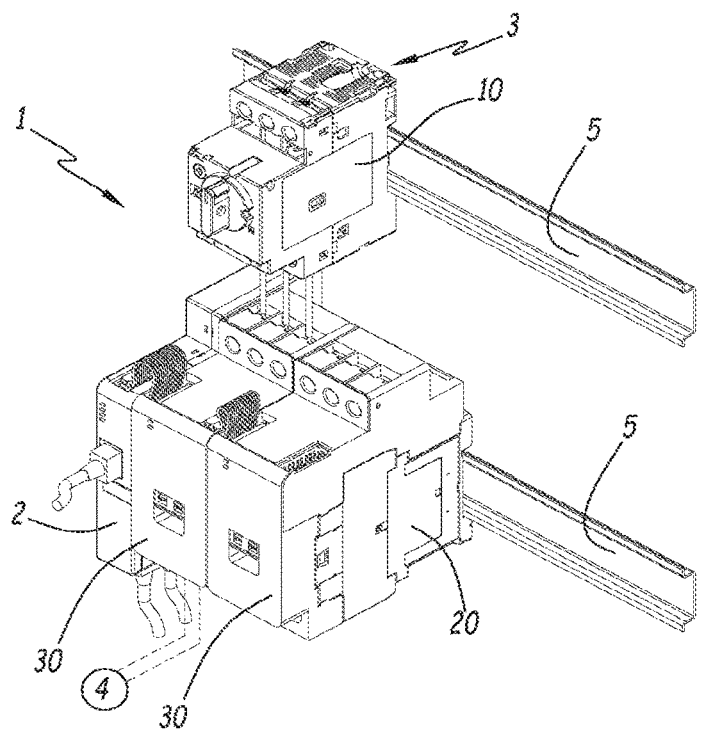
FIG. 1 is a diagrammatic representation of an electrical installation including an electrical assembly including an interconnection module according to the invention.

FIG. 1 shows an electrical installation 1 for controlling a set of electrical loads. This electrical installation 1 includes a central control unit 2, also termed a line head, and a plurality of electrical assemblies 3, each adapted to control the supply of electrical power to an electrical load 4. The central unit 2 and the electrical assemblies 3 are fixed along one or more fixing rails 5, for example of the type known as a "DIN rail". Here these electrical assemblies 3 are identical to one another.

In this example, the electrical loads 4 are industrial electric motors such as asynchronous motors.

To simplify FIG. 1, only two electrical assemblies 3 are shown. The system 1 may instead include a different number of such electrical assemblies 3. Similarly, only one motor 4 is shown.

Each of the electrical assemblies 3 is adapted to control the supply of electrical power to an electrical load 4. To be more precise, each of the electrical assemblies 3 is inserted between an electrical power supply, not shown, and one of the electrical loads 4. The electrical assemblies 3 are therefore adapted to control the supply of electrical power to said electrical load 4, for example selectively in order to activate or deactivate the supply of power to the corresponding electrical load 4. In this example, the electrical power supply unit supplies an electrical power supply current, here a three-phase alternating current.

Figure 2:
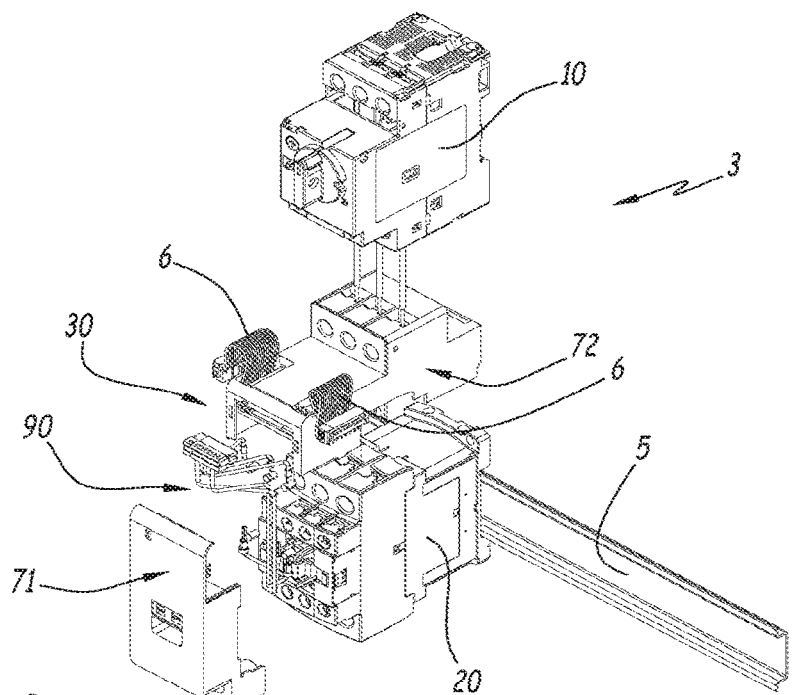
FIG. 2 is a diagrammatic exploded perspective view of an electrical assembly from FIG. 1 including a circuit breaker, a contactor and an interconnection module according to the invention.

As shown in FIG. 2, each of the electrical assemblies 3 includes a circuit breaker 10, a contactor 20 and an interconnection module 30 between the circuit breaker 10 and the contactor 20.

The circuit breaker 10 is adapted to interrupt the flow of electrical current from the power supply in the event of an anomaly or a safety failure. Said failure is for example an overcurrent or a short circuit.

Here the circuit breaker 10 is a multipole circuit breaker including a plurality of electrical poles each associated with one electrical phase of the electrical power supply current. For example, the circuit breaker 10 includes for each pole a current input and a current output interconnected by separatable electrical contacts inside the circuit breaker 10. These electrical contacts can be switched between open and closed states so as to prevent a current from passing between the current input and the current output or respectively to allow a current to pass between the current input and the current output. This switching is performed automatically by an electrical fault detection circuit in the event of an anomaly such as an overcurrent or a short circuit.

The current inputs of the circuit breaker 10 are connected to the electrical power supply.

The contactor 20 is adapted to interrupt or alternately to allow the flow of the electrical current from the output of the circuit breaker 10 going to the corresponding electrical load 4 as a function of a control signal delivered by the central unit 2.

Here the circuit breaker 20 is a multipole circuit breaker including a plurality of electrical poles each associated with one electrical phase of the electrical power supply current. For example, the contactor 20 includes for each pole a current input and a current output interconnected by separatable electrical contacts inside the contactor 20. These electrical contacts are selectively movable between open and closed positions in which they inhibit or respectively allow the flow of an electrical current between the current input and the current output of the contactor 20. This movement in response to the control signal is produced by means of an actuator inside the contactor 20. That actuator includes a solenoid, for example.

The contactor 20 also includes sensors for measuring the status of the separatable electrical contacts. In particular, these sensors are configured to supply a first status signal indicating that the contacts are in a normally closed state, termed an "NC" status signal. These sensors are also configured to supply a second status signal indicating that the contacts are in a normally open or "NO" state. These status signals make it possible to establish a diagnosis of the status of the contactor 20.

The current outputs of the contactor 20 are electrically connected to the corresponding electrical loads 4 to power said electrical loads 4 with the electrical power supply current.

The central unit 2 is notably configured to control each of the contactors 20 selectively and to collect information on the status of each of the contactors 20 supplied by each of said contactors 20. To this end, the installation 1 includes a data bus that connects the various electrical assemblies 3 to the central unit 2. Here this data bus is produced by connecting the electrical assemblies 3 in series, here two by two, by means of ribbon cables 6, as explained in more detail hereinafter.

The interconnection module 30 electrically connects the current outputs of the circuit breaker 10 to the corresponding current inputs of the contactor 20. Moreover, the interconnection module 30 is adapted to measure physical magnitudes representative of the electrical current that flows from the circuit breaker 10 to the contactor 20, as explained in more detail hereinafter. Here the module 30 is intended to be placed above the contactor 20 and below the circuit breaker 10.

FIGS. 3 to 6 show in more detail an example of the interconnection module 30. The interconnection module 30 notably includes power electrical conductors 31, 32 and 33, a support plate 40, an electronic circuit card 50 and a casing 70. The interconnection module 30 further includes a device 60 for measuring a current, a voltage sensor 80 and a data link 90, the respective roles of which are described in more detail hereinafter.

Each power electrical conductor 31, 32 or 33 is adapted to transport an electrical current associated with an electrical phase of the power supply current. Each of the power conductors 31, 32, 33 electrically connects a current output of a pole of the circuit breaker 10 to a corresponding current input of the contactor 20 corresponding to the same pole.

By "power electrical conductor" is meant an electrical conductor adapted to conduct electrical currents of ten amperes and above, preferably 100 amperes and above. By comparison, the electrical currents that flow in the ribbon cables 6 of the data bus are at least ten times lower or 100 times lower than the electrical power supply currents.

Here the electrical conductors 31, 32 and 33 are made of an electrically conductive material such as copper.

Figure 7:
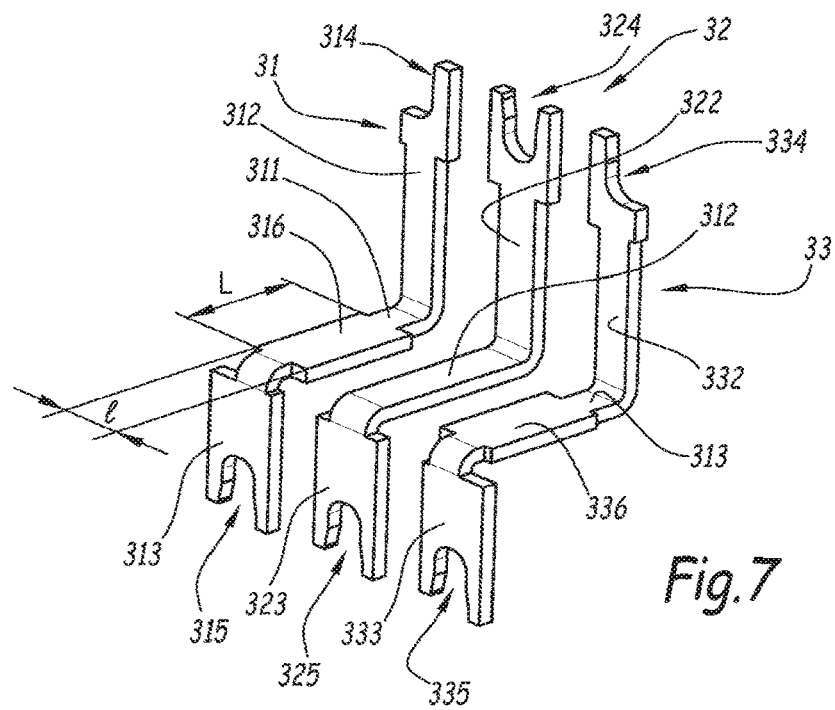
FIG. 7 is a diagrammatic closer view of the power electrical conductors of the interconnection module from FIG. 2.

As shown in FIG. 7, each of the electrical conductors 31, 32, 33 includes a plane central part and upper and lower parts. The central part takes the form of a flat plate. The upper and lower parts project perpendicularly relative to the plane plate, from opposite ends of the central part. These upper and lower parts are parallel to one another on either side of the central part.

The central parts of the electrical conductors 31, 32, 33 are denoted 311, 321 and 331, respectively. The upper parts of the electrical conductors 31, 32, 33 are denoted 312, 322 and 332 and the lower parts of the electrical conductors 31, 32, 33 are denoted 313, 323 and 333.

In an assembled configuration of the module 30, the central parts 311, 321 and 331 are parallel to a geometrical plane P.

Each upper part 312, 322 or 332 ends in a connection area 314, 324 or 334, respectively, including a screw hole adapted to receive a connecting screw so as to form another electrical connection with another electrical connector to connect this power conductor to a current output of the circuit breaker 10.

Similarly, each lower part 313, 323 or 333 ends in a connection area 315, 325 or 335, respectively, including a screwhole adapted to receive a connecting screw so as to form an electrical connection with another electrical connector to conduct this power conductor to a current output of the contactor 20.

In an assembled configuration of the module 30, the electrical conductors 31, 32 and 33 are aligned with one another so that their upper parts 312, 322 and 332 are parallel to one another and their lower parts 313, 323, 333 are parallel to one another. The electrical conductor 32 is disposed between the electrical conductors 31 and 33.

In this example, the power conductors 31, 32 and 33 have a similar shape and so only their differences are described in detail hereinafter.

The electrical conductors 31, 32 and 33 advantageously differ in the specific shape of the connecting area 314, 324, 334 and/or the connecting areas 315, 325, 335. This facilitates visual identification of the various poles and has a poka yoke function that prevents an operative assembling the interconnection module 30 from interchanging the positions of the electrical conductors 31, 32 and 33.

The electrical conductors 31, 32 and 33 also differ from one another in the dimensions of their central parts 311, 321, 331.

In particular, the electrical conductors 31 and 33 have an increased width in their respective central part 311 and 331. This extra width takes the form of a plate 316 and 336, respectively, integrated into the central parts 311 and 331, respectively.

Here the plates 316 and 336 are identical and have a rectangular shape of width "L" and length "l". By way of illustrative example, here the width L is equal to 12 mm and the length l is equal to 6 mm. The width L and the length l are measured parallel to the geometrical plane P in the assembled configuration of the module 30.

The support plate 40 has an essentially plane shape lying in the plane P. This support plate 40 is made from a rigid electrically insulative material, for example plastic material, such as polyamide 6-6.

The support plate 40 includes an area 41 moulded over the central parts 311, 321 and 331 of the electrical conductors 31, 32 and 33, on either side of the opposite faces of said central parts 311, 321, 331. These overmoulded areas 41 make it possible partially to insulate the electrical conductors 31, 32 and 33 electrically from the electronic circuit card 50. The overmoulded areas 41 have dimensions corresponding to the width of the central part 311, 321, 331, notably to take account of the plates 316 and 336 provided at the level of the central parts 311 and 331.

Figure 8:
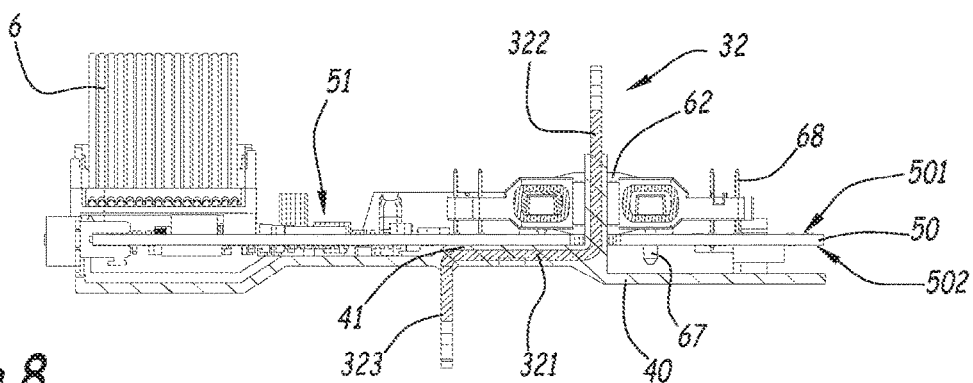
FIG. 8 is a diagrammatic view in longitudinal section of the electronic circuit card from FIGS. 5 and 6.

The electrical conductors 31, 32 and 33 are therefore partly integrated into the support plate 40. The upper parts 312, 322 and 332 and the lower parts 313, 323 and 333 project on either side of the support plate 40, as FIG. 8 shows.

Thanks to the support plate 40 and the overmoulded areas 41, electrical insulation is therefore provided between the electrical conductors 31, 32 and 33 and the electronic circuit card 50.

In this example, the module 30 is intended to be mechanically fixed to the contactor 20. For example, the module 30 includes fixing devices, not shown, for firmly attaching it to the casing of the contactor 20.

In an assembled configuration, as can be seen in FIG. 2, the contactor 20 and the interconnection module 30 therefore form an electrical device. To this end, the casing 70 of the module 30 has a shape complementary to that of the contactor 20.

Figure 3:
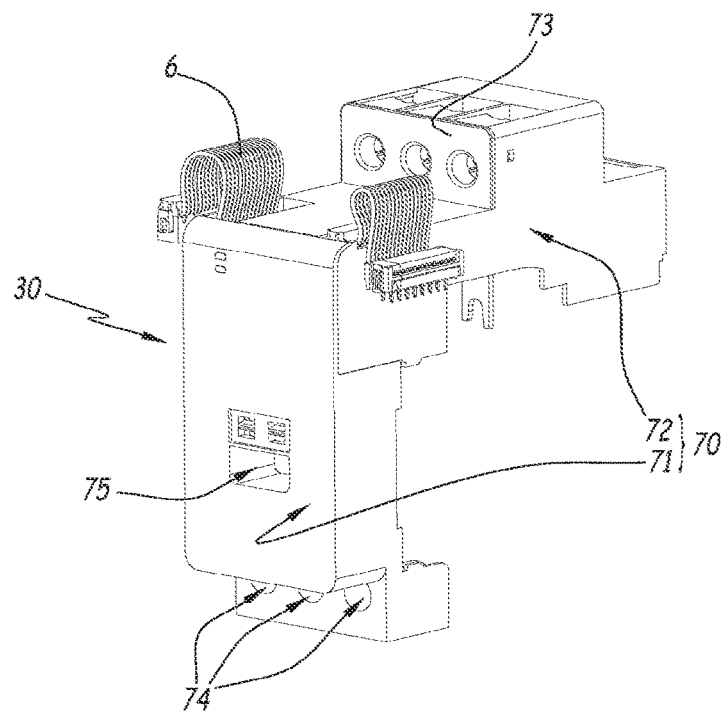
FIGS. 3 and 4 show the interconnection module from FIGS. 1 and 2 diagrammatically in an assembled configuration and in an exploded view, respectively.
Figure 4:
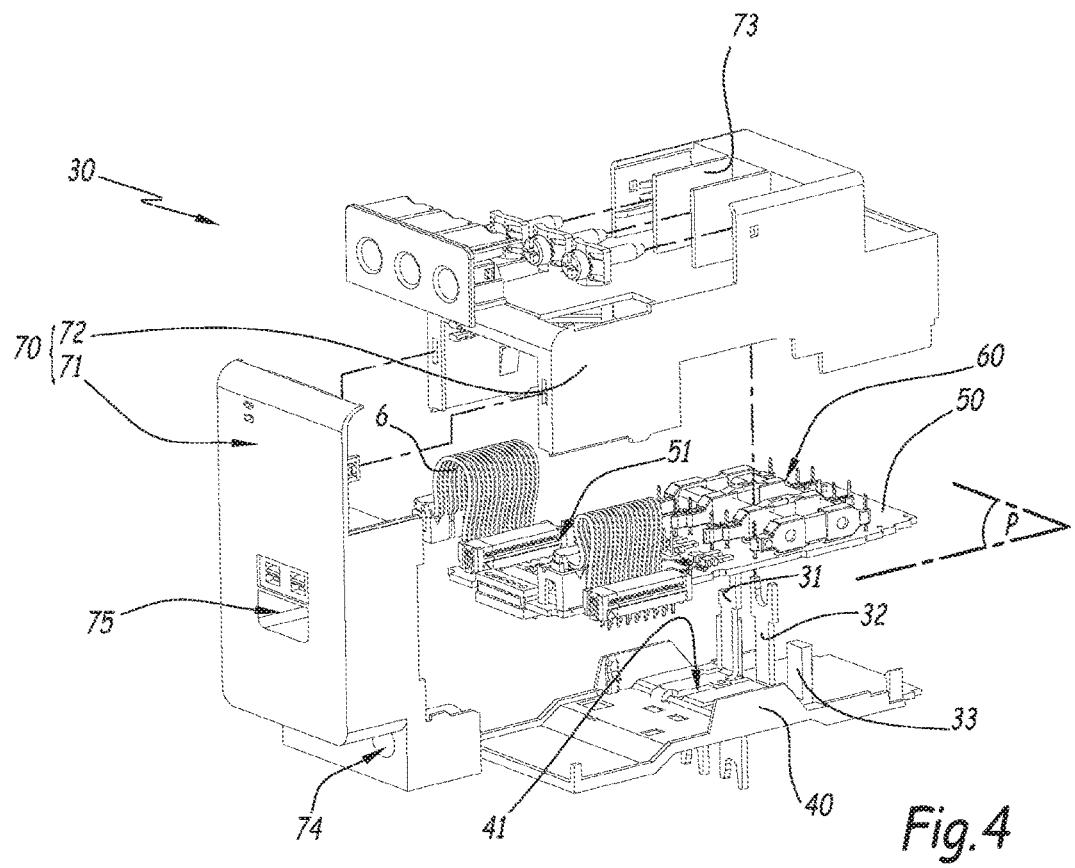

As shown in FIG. 3, the casing 70 more particularly has a shape comprising two principal blocks joined together and extending perpendicularly in an "L-shape". The casing 70 is produced in moulded plastic, for example.

In a configuration with the module 30 mounted on the contactor 20, one of these blocks, termed the front block 71, is in contact with a front face of the contactor 20. The other block, termed the upper block 72, is on an upper face of the contactor 20. The electrical conductors 31, 32 and 33, the plate 40 and the electronic circuit card 50 are housed inside the upper block 72.

The casing 70 includes a body delimiting a hollow housing and a cover that covers and closes the body. Assembling this body and this cover produces the two blocks 71 and 72 of the casing 70.

Alternatively, the shape of the casing 70 may be different.

In an assembled configuration of the module 30, the connecting areas 315, 325 and 335 of the upper parts 312, 322 and 332 extend out of the upper block, here through the cover.

Here the module 30 includes a terminal block 73 to facilitate the connection of the connecting areas 315, 325 and 335 to the corresponding current outputs of the circuit breaker 10. This terminal block 73 is on an upper face of the block 72. Here the terminal block 73 is integrated within the casing 70.

When the terminal block 73 is used, the electrical connection between the connecting module 30 and the circuit breaker 10 is produced by means of dedicated electrical cables the respective terminal ends of which are connected to the power conductors 31, 32 and 33, respectively, by screws in the terminal block 73. The circuit breaker 10 can therefore be fixed at a distance away from the connecting module 30 without it being imperative for it to be in contact with the casing 70. This makes it possible to adapt the use of the module 30 to a great variety of situations, notably depending on the environment of the electrical installation 1.

Alternatively, the terminal block 73 may be mounted so as to be removable from the casing 70.

According to a further alternative, the terminal block 73 may be omitted. If the terminal block 73 is omitted, the connecting areas 315, 325 and 335 of the electrical conductors 31, 32, 33 are directly accessible from outside the casing 70. In this way the circuit breaker 10 can simply plug directly into the connecting module 30. The circuit breaker 10 is then in contact with the module 30. In this case, the module 30 therefore mechanically connects the circuit breaker 10 to the contactor 20.

The front part 71 advantageously includes through-holes 74. These holes 74 are arranged to face corresponding holes in the contactor 20 when the module 30 is mounted on the contactor 20. These holes allow a user to pass a screwdriver through the module 30 in order to access the clamping screws of the contactor 20. These clamping screws are used to connect electrical cables to the current outputs of the contactor 20 in order to connect it to the corresponding electrical load 4. Thanks to this, the module 30 can be used on existing contactors 20 without having to modify the geometry or the architecture of said contactors 20.

The front part 71 optionally has window 75 through it. The window 75 is arranged to face a pre-existing window of the contactor 20 when the module 30 is mounted on the contactor 20. In fact, the contactor 20 includes a window, not shown here, which indicates the position of the separatable electrical contacts and can be used by a user to verify mechanically the position of the separatable electrical contacts. Once again, the module 30 can be mounted on existing contactors 20 without having to modify the geometry or the architecture of said contactors 20.

Alternatively, the holes 74 and/or the windows 75 may be omitted.

Figure 5:
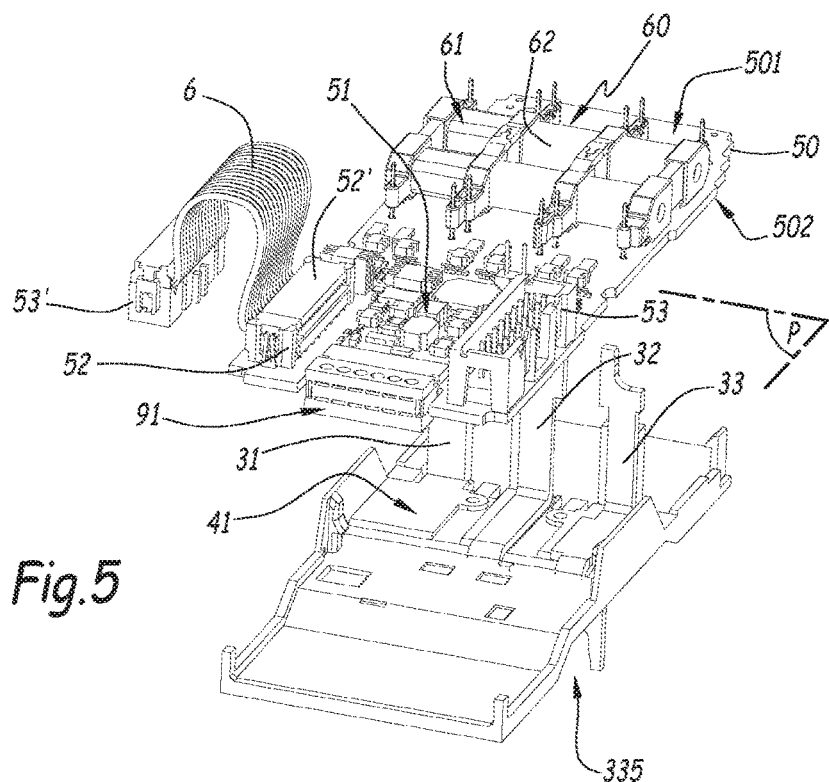
FIGS. 5 and 6 show an electronic circuit card of the interconnection module from FIG. 2 diagrammatically from above and from below, respectively.
Figure 6:
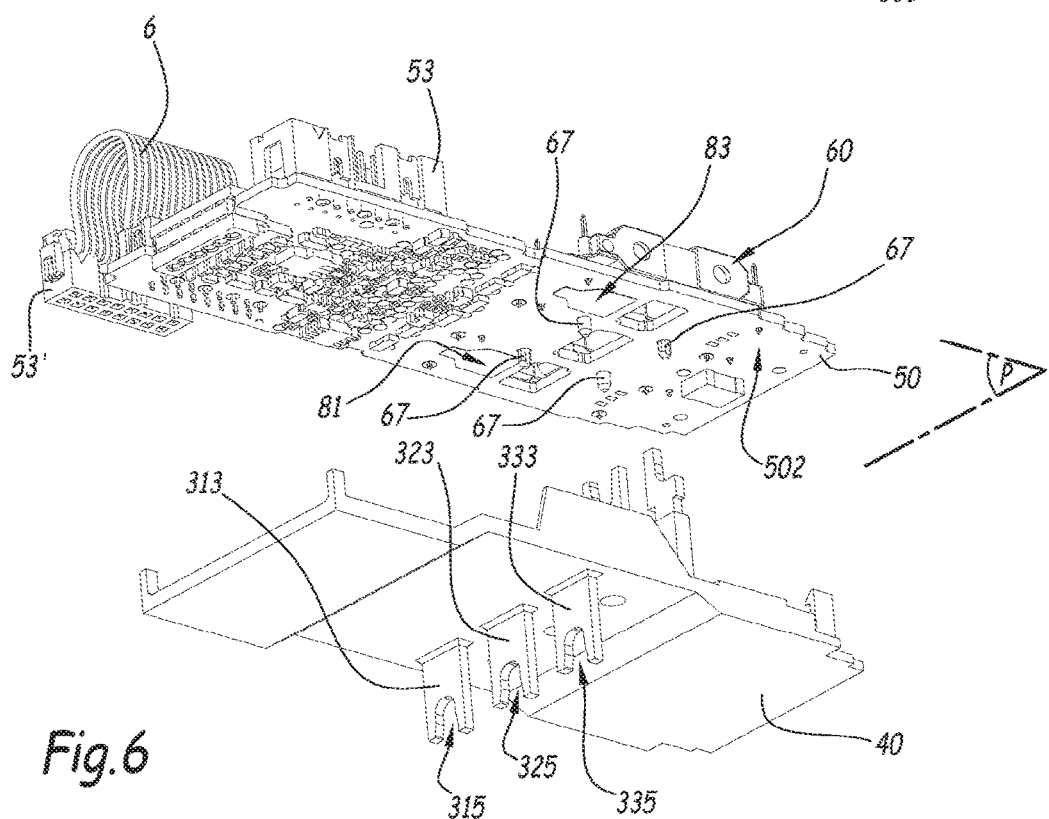

FIGS. 5, 6 and 8 show the electronic circuit card 50 in more detail. The electronic circuit card carries an electronic circuit notably including an electronic unit 51 the role and the function of which are described hereinafter. The electronic unit 51 is a programmable microcontroller, for example.

Here the electronic circuit card 50 includes a printed circuit produced on a rigid insulative support by means of electrically conductive tracks. The insulative support is for example an epoxy resin printed circuit board (PCB-A).

"501" denotes the upper face of the electronic circuit card 50 and "502" denotes a lower face of the electronic circuit card 50, opposite the face 501.

In this example, the electronic components of the electronic circuit on the electronic circuit card 50 are on the upper face 501. The electrically conductive tracks forming the printed circuits are on the opposite lower face 502.

In an assembled configuration of the module 30, the electronic circuit card 50 is parallel to the support plate 40 and therefore parallel to the geometrical plane P. Here the electronic circuit card 50 is at least partly in contact with the plate 40.

The electronic circuit card 50 has a plurality of holes through it, termed passage holes, allowing the passage of the upper parts 312, 322 and 332 of the electrical conductors 31, 32 and 33. In this way, when the module 30 is in an assembled configuration, each of the electrical conductors 31, 32 and 33 passes through the electronic circuit card 50. The upper parts 312, 322 and 332 are then perpendicular to the electronic circuit card 50.

Alternatively, the electronic circuit card 50 is under the central parts 311, 321, 331 so that the lower parts 313, 323 and 333 of the electrical conductors 31, 32 and 33 pass through it. In this case, the faces 501 and 502 are interchanged.

The electronic unit 51 includes a connection interface adapted to be connected to the data bus. To this end the electronic circuit card 50 includes connectors 52 and 53 fixed to the upper face 501 and connected to the electrically conductive tracks of the printed circuit. These connectors 52 and 53 are configured to be connected to corresponding connectors 52' and 53', respectively, of the ribbon cable 6. For example, the connectors 52' and 53' are at opposite ends of a flexible electrical ribbon cable. Here the connectors 52 and 53 are of different types and notably of different sizes so as to prevent any unwanted interchanging of the ribbon cables 6 forming the data bus. In this example, the connector 53 is accessible from outside the casing 70 of the module 30.

The data bus allows the exchange of data between the module 30 and the exterior of the electrical assembly 3. This data consists for example of control signals of the actuator of the contactor 20 or signals indicating the status of the contactor 20. The data bus also carries an electrical power supply of the electronic circuit card 50, for example an electric voltage less than or equal to 24 V DC.

In this example, in an assembled configuration of the module 30 one of the ribbon cables 6 is connected to the electronic circuit card 50 via the connector 52', the latter being received inside the corresponding connector 52. This connection is made during the manufacture of the module 30, for example, before closing the casing 70, so that the end of the ribbon cable 6 including the connector 53' extends out of the casing 70. The connector 53' can then be electrically connected to a corresponding connector 53 of the module 30 of another electrical assembly 3 of the installation 1 or to the central unit 2.

Figure 9:
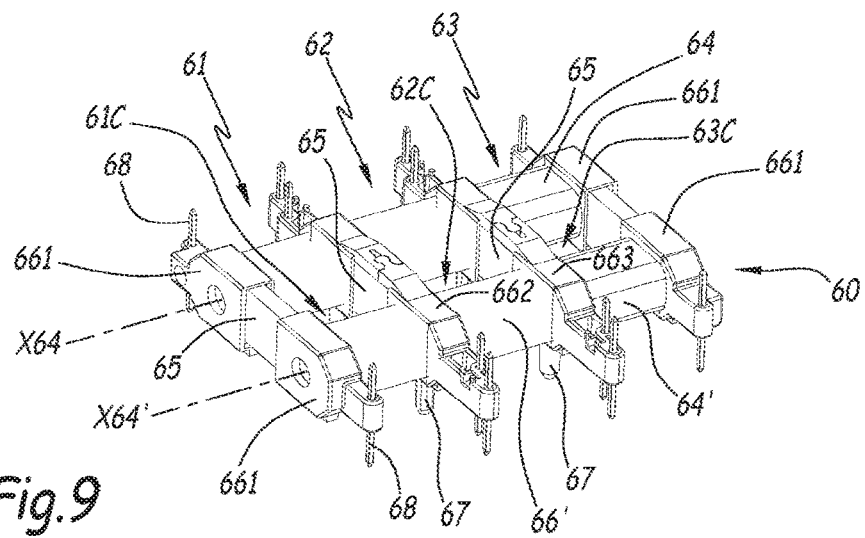
FIGS. 9 and 10 are diagrammatic perspective views of a device for measuring the current flowing through the power electrical conductors from FIG. 7.
Figure 10:
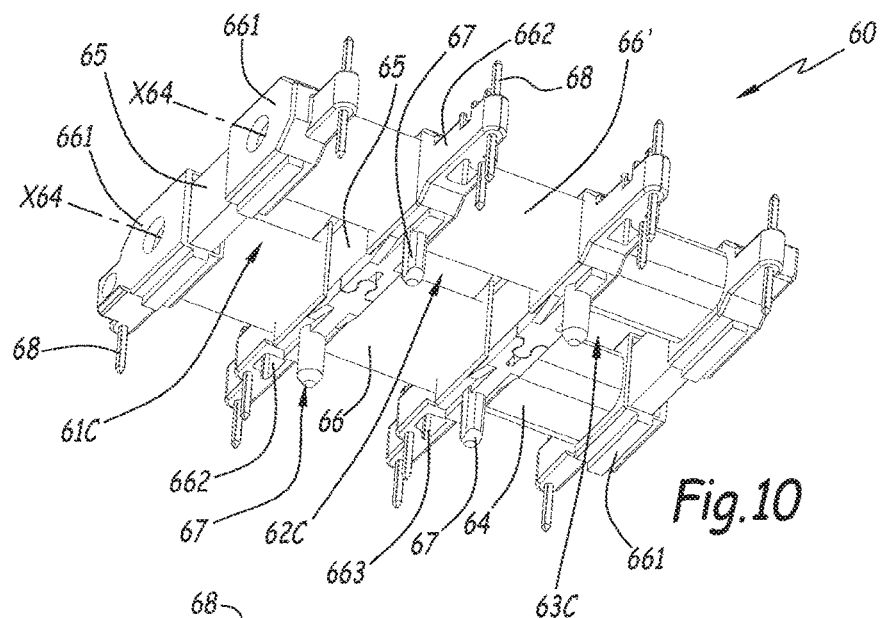
Figure 11:
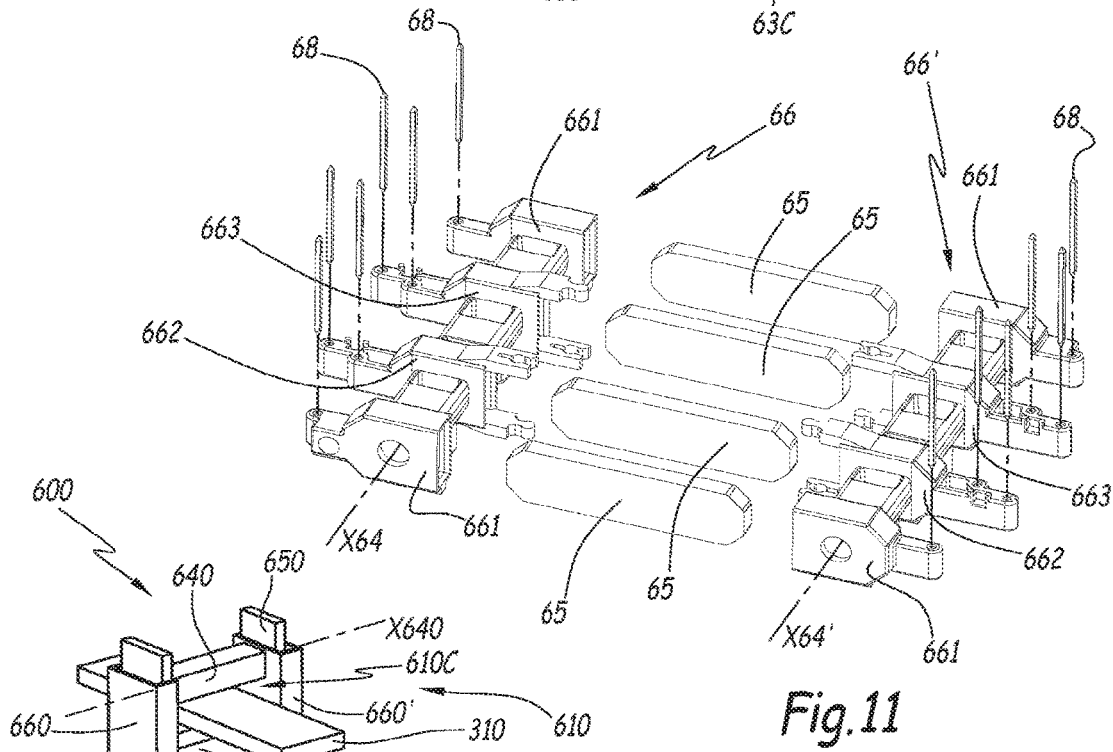
FIG. 11 is a diagrammatic exploded view of the current measuring device from FIGS. 9 and 10.

The module 30 further includes a current measuring device 60 shown in more detail in FIGS. 9, 10 and 11.

The measuring device 60 is configured to measure the electrical currents flowing in the electrical conductors 31, 32 and 33. To this end the measuring device 60 includes a plurality of Rogowski type current sensors 61, 62, 63 each of which is adapted to measure the electrical current flowing in a respective one of the electrical conductors 31, 32 and 33. Rogowski type sensors make it possible to determine the current that is flowing in an electrical conductor by measuring the magnetic flux induced around that electrical conductor by the flow of the electric current in it.

Here the current sensors 61, 62 and 63 are adjacent two by two and aligned in rectilinear fashion. Each of the current sensors 61, 62 and 63 includes coils or solenoids 64 and 64', which here are identical, and a central zone 61C, 62C, 63C receiving the corresponding electrical conductors 31, 32 and 33. Here the measuring device 60 is fixed to the upper face 501 of the electronic circuit card 50.

In an assembled configuration of the connecting module 30, each of the electrical conductors 31, 32 and 33 is received in the respective central opening 61C, 62C and 63C of the current sensors 61, 62 and 63. The measuring device 60 therefore makes it possible to measure in real time the electrical currents flowing in the electrical conductors 31, 32, 33 between the circuit breaker 10 and the contactor 20.

The coils 64 and 64' are adapted to be electrically interconnected to form a circuit for measuring the current in the corresponding conductor. The coils 64 and 64' are rectilinear and extend along respective longitudinal axes X64 and X64'. Here each coil 64, 64' includes a solenoid formed by a coil of conductive wire with 520 turns, for example, divided across five layers with each of the coils 64, 64' having an inductance of 0.7 mH.

The measuring device 60 further includes a plurality of ferromagnetic bars 65, which here are identical, and first and second armatures, or frames, respectively denoted 66 and 66', carrying the coils 64 and 64'. In this example, the armatures 66 and 66' are parallel to each other and are common to all the current sensors 61, 62 and 63 of the measuring device 60.

The magnetic bars 65 enable channelling of the magnetic flux generated when an electrical current flows in the corresponding electrical conductor 31, 32, 33 so as to facilitate its measurement by the coils 64 and 64'. For example, the ferromagnetic bars 65 are made from an iron alloy, such as soft iron or a nickel-iron alloy NiFe or an FeSi alloy. Here there are four ferromagnetic bars 65.

Accordingly, when electrical current flows through the electrical conductors 31, 32 and 33 magnetic fluxes appear that generate an electrical potential difference at the terminals of the coils 64 and 64' of the corresponding current sensors 61, 62 and 63. These electrical potential differences are measured by the electronic unit 51, for example using an analogue-digital converter that is not shown. The electronic unit 51 then deduces automatically the corresponding electrical current in each of the electrical conductors 31, 32 and 33, for example using a predetermined formula.

Here the current sensors 61, 62 and 63 are identical and so only the current sensor 61 is described in detail hereinafter, given that its description can be transposed to the others.

To be more precise, the current sensor 61 includes two parallel coils 64 and 64' face to face on opposite sides of the central zone 61C. The current sensor 61 further includes two ferromagnetic bars 65. These ferromagnetic bars 65 are in the same plane as the coils 64 and 64' and extend between the ends of the coils 64 and 64' perpendicularly to the axes X64 and X64'.

Each of the current sensors 61, 62, 63 includes a ferromagnetic bar 65 shared with the immediately adjacent current sensor. In this instance, the current sensor 61 here shares a bar 65 with the current sensor 62. Similarly, the current sensor 63 shares a bar 65 with the current sensor 62.

Accordingly, in this example, the measuring device 60 includes three coils 64 and three coils 64'. The measuring device 60 also includes four ferromagnetic bars 65 that extend between the coils 64 and the coils 64'. The coils 64, 64' and the ferromagnetic bars 65 are arranged in a common plane parallel to the geometrical plane P so as to form a polygonal, here square, contour for this current sensor 61. This polygonal contour delimits the corresponding central opening 61C.

In a preferred embodiment of the invention, each of the armatures 66 and 66' has a rectilinear shape. The coils 64 and 64' are wound on these armatures 66 and 66'. Accordingly, the longitudinal axis of the coil X64 or X64' coincides with a longitudinal axis of the respective armature 66 or 66'. The coil 64 is wound around the armature 66 and the coil 64' is wound around the armature 66'.

In this example, each of the armatures 66 and 66' includes housings or cells configured to receive one end of one of the ferromagnetic bars 65.

Here there are four of these housings. There are housings 661 at the ends of the armatures 66 and 66'. There are housings 662 and 663 between the housings 661. Alternatively, the number of housings of this kind may be different, preferably at least equal to 2.

In this example, the ferromagnetic bars take the form of a plate of rectangular parallelepiped shape. By way of illustration, each ferromagnetic bar 65 has a length of fifteen millimeters, a width of five millimeters and a thickness of two millimeters. The housings 661 have a shape complementary to that of the ends of the bar 65. Here the housings 661, 662 and 663 are integrated inside the armatures 66 and 66'. In fact, here these housings 661, 662 and 663 make it possible to delimit winding areas of the coils 64 and 64'.

The armatures 66 and 66' advantageously include fixing elements 664 and 665 intended to connect this armature firmly to the opposite armature to form the measuring device 60. These fixing elements 664 and 665 also make it possible to hold the ferromagnetic bars 65 in position. In this example, the fixing elements 664 and 665 are supported by the housings 662 and 663.

Here the fixing elements 664 and 665 can be nested and are of complementary shape, for example of the mortice-and-tenon type, allowing nesting by clipping. Alternatively, they may be produced differently, for example by means of hooks.

By way of illustration, the intermediate housing 662 of the armature 66 carries a male fixing element 664. The housing 662 of the armature 66' facing the housing 662 in an assembled configuration of the measuring device 60 for its part carries a female fixing element 665.

The armatures 66 and 66' carry fixing studs 67 that project from the measuring device 60 perpendicularly to the geometrical plane P when the measuring device 60 is in an assembled configuration on the electronic circuit card 50.

As shown in FIG. 9, the fixing studs 67 are on the same side of the measuring device 60, to be more precise on the side of the measuring device 60 that is intended to come into contact with the electronic circuit card 50. These fixing studs 67 are intended to be received in corresponding holes through the electronic circuit card 50. On the one hand this makes it possible to fix the measuring device 60 to the electronic circuit card 50 but also makes it possible to facilitate aligning the measuring device 60 so that the central openings 61C, 62C and 63C face the openings in the electronic circuit card 50 for the electrical conductors 31, 32 and 33 to pass through.

The measuring device 60 further includes connecting pins 68, here on the armatures 66 and 66', for connecting the coils to distal ends of the housings 661, 662 and 663. The function of these connecting pins 68 is to connect the opposite ends of each of the coils 64 and 64' electrically to the control unit 51 via the electrically conductive tracks of the electronic circuit card 50, with which they are intended to come into direct electrical contact. To be more precise, the ends of the wire forming the winding of each of the coils 64 and 64' are then wound around this pin 68 to make an electrical connection. Each connecting pin 68 takes the form of a straight rod made of an electrically conductive material one end of which is received in the electronic circuit card 50 in order to make an electrical connection with an electrical track of the electronic circuit card 50.

The modular design of the measuring device 60 makes it possible to simplify its industrial manufacture and to reduce its unit cost. In fact, here the armatures 66 and 66' are identical and differ from each other only in their relative position within the measuring device 60. The measuring device 60 is formed by assembling the armatures 66 and 66' together in a head-to-tail arrangement. The measuring device 60 can therefore be manufactured using a small number of parts.

Moreover, using ferromagnetic bars 65 reduces the cost of the measuring device 60 relative to existing Rogowski type current measuring devices in which the entire perimeter of each central opening is provided with a solenoid or coil winding. In this instance, two coils 64, 64' are necessary for each of the current sensors 61, 62 and 63, which is fewer than in known Rogowski type current sensors in which at least four such coils are necessary.

The measuring device 60 can be manufactured industrially in the following manner.

In a first step, an armature 66 or 66' is acquired. This armature 66 or 66' is provided beforehand with connecting pins 68.

Then, in a second step, coils 64 are formed by winding on winding areas of the armature 66, for example using an automatic winding machine. Firstly, the conductive wire is first wound around one of the connecting pins 68, with one turn, and is then wound repetitively around a first winding zone of the armature 66 to form a first coil 64. This wire is then wound around another connecting pin of the armature 66. The wire is then cut, after which the above operation is repeated in a similar manner for each of the winding zones of the armature 66. The coils are therefore formed around the armature 66 in a simplified manner.

The measuring device 60 is then assembled in a third step. To this end, the armatures 66 and 66' carrying the coils 64 and 64' are joined together, facing each other. Ferromagnetic bars 65 are inserted in each of the housings 661, 662 and 663 of the armature 66. The armature 66 is then fixed to the armature 66' by inserting the opposite end of each of the ferromagnetic bars 65 into the corresponding housings 661, 662 and 663 of the armature 66'. The fixing elements 664 and 665 are then inserted one in the other and then fixed by clipping them to fasten together these armatures 66 and 66'.

The measuring device 60 is then ready to be mounted on the electronic circuit card 50.

Figure 12:
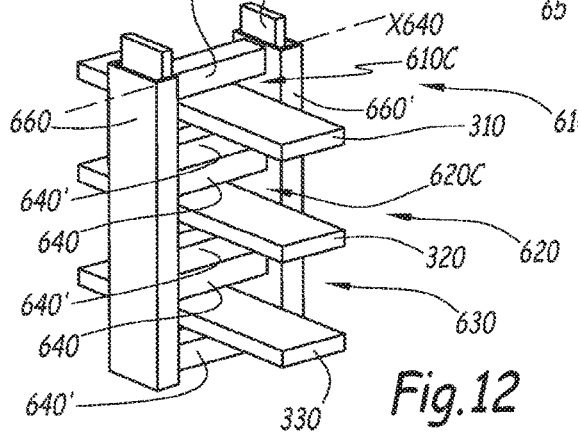
FIG. 12 shows diagrammatically another embodiment of the current measuring device from FIGS. 8 to 10.

FIG. 12 shows another embodiment of a measuring device 60. "600" denotes the current measuring device in this embodiment. This measuring device 600 is particularly suitable for a variant of the connecting module 30 in which the electrical conductors 31, 32 and 33 are replaced by power electrical conductors 310, 320 and 330 superposed on one another.

The elements of this measuring device 600 that are analogous to those of the measuring device 60 bear the same references with a zero added. For example, the measuring device 600 includes ferromagnetic bars 650 and are similar to the ferromagnetic bars 65 of the measuring device 60. These elements are therefore not described in detail, given that the above description can be transposed to them. Here there are two bars 650.

The measuring device 600 differs from the measuring device 60 notably in that the armatures 660 and 660' each include a rectilinear principal part and secondary parts in the form of branches that project perpendicularly from the principal part.

In this example, the armatures 660 and 660' each include three secondary parts on the same side of the principal part and so these armatures are E-shaped. The coils 84 are therefore formed on the projecting secondary parts of the armature 660. The coils 640' for their part are formed on the projecting secondary parts of the armature 660'.

Each of the principal parts of the armatures 660 and 660' includes an opening extending over the entire length of the principal part which receives one of the ferromagnetic bars 650.

Thanks to this arrangement, the armatures 660 and 660' can be assembled together around the electrical conductors 310, 320 and 330.

Figure 13:
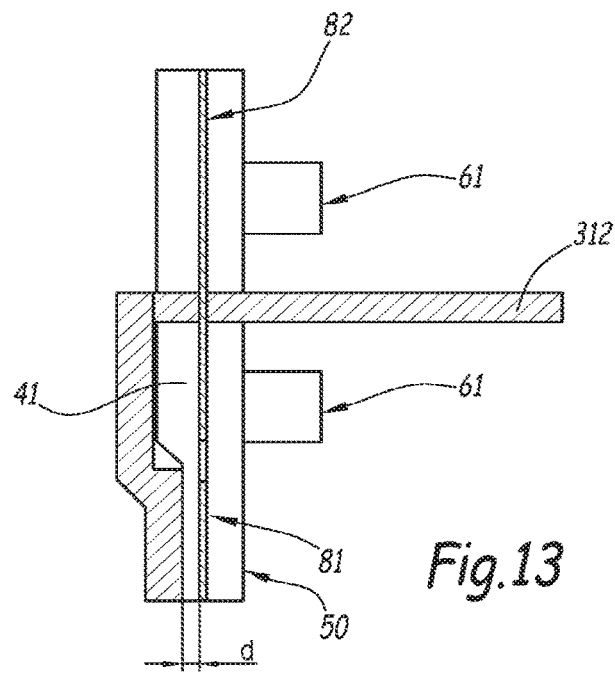
FIG. 13 is a diagrammatic sectional view of an electrical voltage sensor with which the interconnection module from FIG. 2 is equipped.
Figure 14:
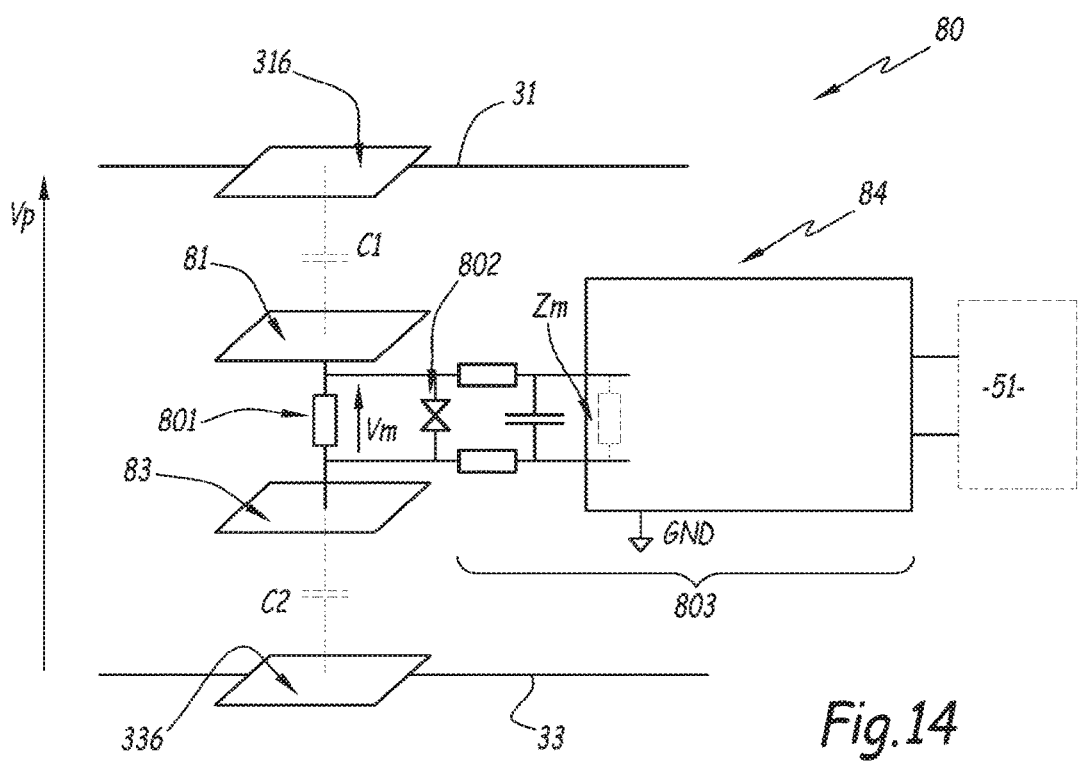
FIG. 14 is an electrical circuit diagram of the voltage sensor from FIG. 10.

FIGS. 13 and 14 show the voltage sensor 80 in more detail.

The object of the voltage sensor 80 is to detect the presence of an electrical potential difference between two of the electrical conductors 31, 32 and 33, here between the electrical conductors 31 and 33. This provides an indirect way to discover the status of the circuit breaker 10 and notably to determine whether this circuit breaker is open or closed. The electronic unit 51 is moreover configured to generate a signal representative of the status of the circuit breaker 10 by means of data supplied by the voltage sensor 80.

The voltage sensor includes at least one electrically conductive plate or electric field sensor at a distance from and facing one of the plates 316, 326 or 336 of the respective electrical conductors 31, 32 or 33. The presence or alternatively the absence of an electric voltage is determined indirectly, as a function of the electrical capacitance between these plates, by a dedicated measuring circuit 84.

To be more precise, here the detector 80 includes two such plates 81 and 83 made of a conductive material and parallel to the geometrical plane P. In an assembled configuration of the module 30 the plate 81 faces and is aligned with the plate 316. Similarly, the plate 83 faces and is aligned with the plate 336. These plates 81 and 83 are formed on the face 502 of the electronic circuit card 50, for example by depositing a metal track consisting of copper. The plates 81 and 83 have dimensions identical to the plates 316 and 336, respectively, to within 5% or preferably to within 1%. Here the plates 81 and 83 have identical areas. The plates 81 and 316 are separated from each other by and in contact with the overmoulded part 41. The same applies to the plates 83 and 336, respectively.

"d" denotes the distance between the plates 81 and 316 measured in a direction perpendicular to the geometrical plane P. This distance d is equal to the thickness of the overmoulded part 41 that covers an upper face of the plate 316. The distance d is chosen so that the plate 81 is as close as possible to the plate 316 without this compromising the electrical insulation function of the overmoulded part 41 in respect of the power conductor 31. The distance d is preferably less than or equal to 2 mm, more preferably between 0.5 mm and 1 mm inclusive, and even more preferably between 0.65 mm and 0.85 mm inclusive. By way of illustration, here the distance d is equal to 0.8 mm. The plates 83 and 336 are also the distance d apart.

C1 denotes the capacitor formed by the plates 81 and 316 and C2 the capacitor formed by the plates 83 and 336. Here the respective electrical capacitances of the capacitors C1 and C2 are equal, given the dimensions and the relative dispositions of the plates 81, 83, 316 and 336.

The capacitance of the capacitor C1 is equal to $(\epsilon \times S)/d$, where S is the area of the plates 81 and 316 facing each other and "$\epsilon$" is the electrical permittivity of the material forming the overmoulded part 41. Here the area S is equal to the product of the length L by the width l given that the plates 81 and 316 are identical and face each other. Given the numerical values indicated above, here the area S is equal to 74 mm². In the case of polyamide 6-6, the capacitor C1 has a capacitance value between 2.8 pF and 4.4 pF inclusive if the distance d is between 0.65 mm and 0.85 mm inclusive. The person skilled in the art knows that the capacitance of the capacitor C1 is inversely proportional to the distance d.

The sensor 80 also includes a measuring circuit 84 that includes the plates 81 and 83 as well as a measuring resistor 801 the ends of which are connected to the plate 81 and to the plate 83. The measuring circuit 84 is adapted to acquire a measured voltage Vm at the terminals of the measuring resistor 801.

The measuring circuit 84 advantageously includes a bidirectional Zener diode 802 that protects the measuring circuit 84 against overvoltages, notably liable to occur if the electrical installation 1 or its electrical power supply is struck by lightning.

The measuring circuit 84 is connected to an input of the electronic unit 51 via an analogue-digital converter, not shown. The measuring circuit 84 advantageously also includes a low-pass filter 803 configured to pass frequencies in the range 45 Hz-65 Hz.

The filter 803 makes it possible to avoid saturation of the input of the analogue-digital converter, which could lead to a malfunction of the sensor 80. A filter 803 of this kind notably makes it possible to filter harmonics of the electrical power supply current that could interfere with the measurement by the circuit 83. Here the electrical power supply current of the electrical assembly 3 has a frequency equal to 50 Hz or 60 Hz.

The sensor 80 finally includes an electrical ground plane 82 on the face 502 and connected to an electrical ground GND of the measuring circuit 84 to protect the device 80 against electromagnetic interference. This ground plane 82 is produced by depositing a metal layer on the face 502 over an area facing the area occupied by the current sensor 61.

In this example, the presence of an electrical voltage is detected by the voltage sensor 80 between the electrical conductors 31 and 33. If an electrical voltage Vp is present between these electrical conductors 31 and 33, the measured voltage Vm at the terminals of the resistor 801 is equal to a value that depends on the voltage Vp and the capacitance of the capacitors C1 and C2. The voltage Vm is calculated using the following formula, for example:

$$Vm = \frac{Vp \times (Rm + Zm)}{Zm + C}$$

where "Rm" is the resistance of the measuring resistor 801, "Zm" is the measuring impedance at the input of the electronic unit 51 and "C" is the capacitance of the capacitors C1 and C2.

By way of illustration, for a voltage Vp equal to 380 V at a frequency of 50 Hz the voltage Vm is equal to 150 mV.

According to another illustrative example, for a voltage Vp equal to 190 V at a frequency 60 Hz the voltage Vm is equal to 62 mV.

On the other hand, the measured voltage is zero in the absence of any electrical voltage between the electrical conductors 31 and 33.

The unit 51 is programmed to measure the measured voltage supplied by the measuring circuit 84, for example continuously or repetitively over time, and to generate a corresponding status signal as a function of the acquired measured voltage Vm. The unit 51 then sends this status signal to the data bus, for example at a predetermined time or in response to a request sent by the central unit 2.

For example, the electronic unit 51 automatically determines that no electrical voltage is present between the electrical conductors 31 and 33 if the measured voltage Vm remains zero for a long time, for example for more than ten times the duration of the frequency of the power supply electric current, preferably more than 100 times this. Otherwise the electronic unit 51 determines than an electrical voltage is present between the electrical conductors 31 and 33.

A voltage sensor 80 of this kind makes it possible to detect the presence or alternatively the absence of an electrical voltage and thus to extrapolate the status of the circuit breaker 10 of the electrical assembly 3 of which the module 30 is part without needing physically to access the circuit breaker 10. Such detection is achieved without direct electrical contact with the electrical conductors 31, 32 and 33. It is therefore not necessary to equip the voltage sensor 80 with galvanic insulation, which is more costly and more complicated to incorporate. The accuracy of the measurement is not an obstacle to the correct operation of the voltage sensor 80 since it is mainly required here to know whether an electrical voltage Vp is present or not between the power conductors 31 and 33 and not necessarily to obtain an accurate value of that electrical voltage.

Alternatively, the voltage sensor 80 may be produced differently, for example by replacing the plates 81 and 83 with a single electric field sensor disposed to face one of the central parts 311, 321 or 331.

According to another variant, the voltage sensor 80 is replaced by a voltage sensor including a divider bridge directly connected to the electrical conductors 31, 32 and 33. In this case, galvanic insulation is necessary.

Figure 15:
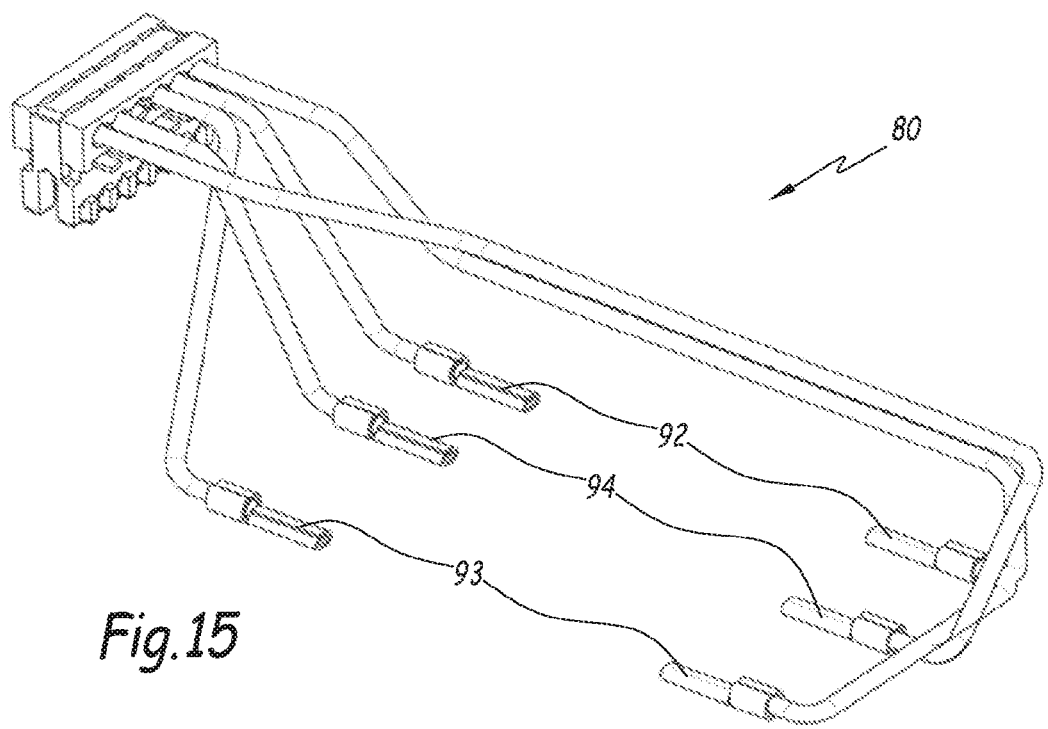
FIGS. 15 and 16 show diagrammatically two embodiments of a data link between the interconnection module and the contactor from FIG. 2.
Figure 16:
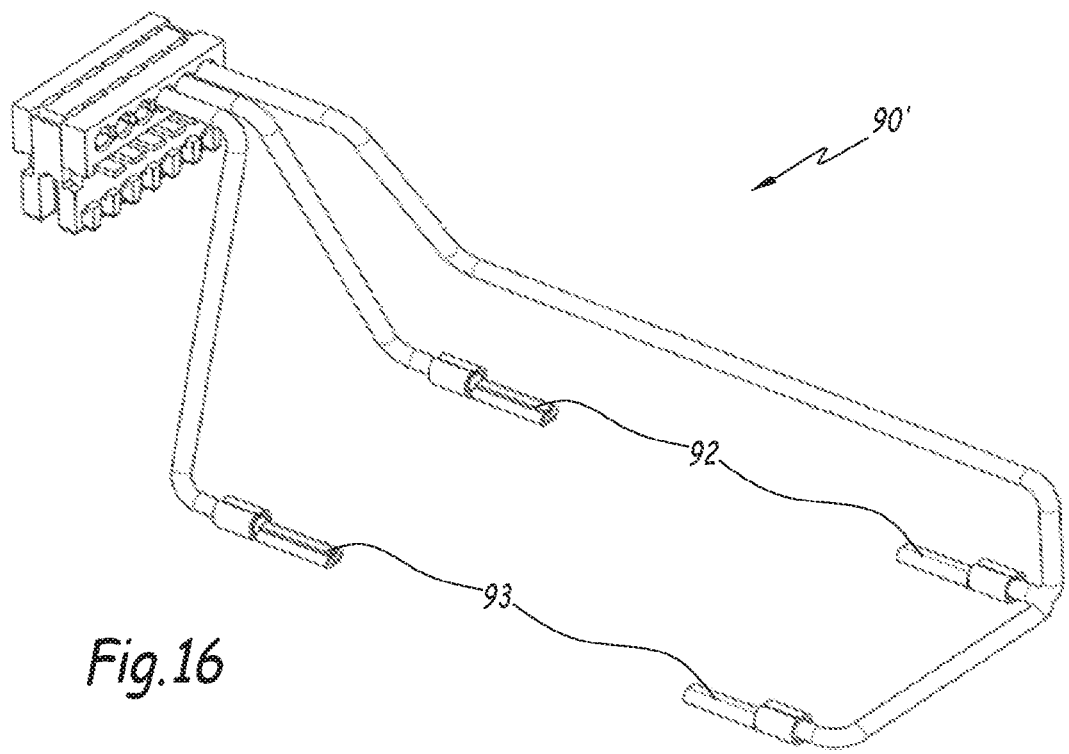

FIGS. 15 and 16 show the data link 90 between the module 30 and the contactor 20. This data link 90 is adapted to transmit a control signal to open or close the contactor 20. This data link 90 is also adapted to collect one or more signals measuring the status of the contactor 20. This device 90 is adapted to be connected to a corresponding signal input/output interface of the contactor 20.

To be more precise, the connection 90 includes a connector 91 and pairs 92, 93 and 94 of wires. The connector 91 is adapted to be connected to the electronic circuit card 50. For example, here the connector 91 is fixed to the card 50 at one of the ends of said electronic circuit card 50.

The link 90 advantageously includes a rigid armature on which the pairs 92, 93 and 94 of wires are mounted. For example, this armature is made of plastic moulded over the pairs 92, 93 and 94 of wires. This facilitates mounting the module 30 on the contactor 20, notably by reducing the space occupied by the wires 92, 93 and 94. This armature may be omitted.

The connector 91 includes a plurality of openings each intended to receive one of the wires of the pairs 92, 93 and 94 of wires so as to connect them electrically to corresponding electrical tracks of the printed circuit of the electronic circuit card 50.

For example, the wires of the pair 92 of wires are intended to supply electrical power to the actuator of the contactor 20. The pair 93 of wires is configured to collect the NO status signal from a corresponding output interface of the contactor 20. In a similar way, the wires of the pair 94 of wires are adapted to collect the NC status signal from the corresponding output interface of the contactor 20.

In this example, as shown in FIG. 11, one of the terminals associated with the wire 92 is common with one of the terminals associated with the wire 93. For example, this is because the corresponding signals are generated relative to a common electrical ground in the electrical contact 20. Alternatively, these two wires may be separate from each other.

FIG. 12 shows another embodiment of the link 90. This data link, denoted 90', is similar to the link 90 but differs from it in that the pair 94 of wires is omitted. This is useful in applications where it is not necessary to know the NC status signal.

Thanks to the measuring device 60, the voltage sensor 80 and the electronic control unit 51, the module 30 enables real time collection of information on the operating status of the circuit breaker 10 and the contactor 20 and improved control of them as a function of that information and/or from the central unit 2.

Thanks to this module 30, the electrical assembly 3 has advanced communication and control functions without it being necessary to modify the architecture or the operation of the circuit breaker 10 or the contactor 20. The module 30 therefore makes it possible to add new functionalities to existing product ranges, and even to circuit breakers 10 and/or contactors 20 already installed on an existing electrical installation 1.

The embodiments and the variants envisaged above may be combined with one another to generate new embodiments.

The invention claimed is:

1. A module for interconnection between an electrical circuit breaker and an electrical contactor comprising:
    a housing;
    multiple power electrical conductors housed inside the housing, each of the power electrical conductors being configured to electrically connect an electrical output of a circuit breaker to an electrical input of a contactor, in order to supply electrical current to flow from the circuit breaker to the contactor;
    a device configured to measure the electrical current that flows through the power electrical conductors;
    an electrical voltage sensor configured to detect a voltage between at least two of the power electrical conductors; and
    an electronic processor equipped with an interface configured to connect to a data bus and to transmit values of the electrical current measured by the measurement device to the data bus.

2. The interconnection module according to claim 1, wherein the electronic processor is electrically connected to the voltage sensor and is configured to transmit a signal to the data bus if an electrical voltage is detected by the voltage sensor.

3. The interconnection module according to claim 1, wherein the current measuring device includes Rogowski current sensors, each mounted around one of the power electrical conductors to measure the electrical current that flows in that power electrical conductor.

4. The interconnection module according to claim 1, wherein the voltage sensor includes at least one electrically conductive plate disposed at a distance from and facing one of the power electrical conductors, the electrical voltage being detected as a function of a value of electrical capacitance between the electrically conductive plate and the corresponding power electrical conductor.

5. The interconnection module according to claim 1, further comprising a data link configured to be connected to a control circuit of the contactor, the electronic processor being configured to deliver a control signal to the contactor via said interface.

6. The interconnection module according to claim 1, further comprising a separation plate housed inside the housing and including an area at least partly moulded over the power electrical conductors.

7. The interconnection module according to claim 6, wherein the electronic processor is on an electronic circuit card fixed to the separation plate.

8. An electrical device comprising:
    an electrical contactor including separable electrical contacts configured to connect selectively or to insulate electrically current inputs and current outputs of the contactor from one another in response to a control signal; and
    an interconnection module including power electrical conductors electrically connected to the current inputs of the electrical contactor and configured to electrically connect said electrical contactor to an electrical circuit breaker,
    wherein the interconnection module is as claimed in claim 1, the power electrical conductors of the interconnection module being electrically connected to the current inputs of the contactor.

9. The electrical device as claimed in claim 8, wherein the interconnection module is connected to a corresponding interface of the electrical contactor to switch the movement of the separable contacts of the contactor between open and closed states.

10. An electrical assembly comprising:
    an electrical circuit breaker; and
    an electrical device including an electrical contactor and an interconnection module connected to the contactor,
    wherein the interconnection module is between the circuit breaker and the contactor and electrically connects the circuit breaker to the contactor, and
    the electrical device is as claimed in claim 8.

* * * * *